(12) United States Patent
Song et al.

(10) Patent No.: US 10,600,383 B2
(45) Date of Patent: Mar. 24, 2020

(54) INTERPOLATION AMPLIFIER AND SOURCE DRIVER INCLUDING THE SAME

(71) Applicant: Samsung Electronics Co., Ltd., Suwon-si, Gyeonggi-do (KR)

(72) Inventors: Yongjoo Song, Hwaseong-si (KR); Pan-soo Kim, Yongin-si (KR); Jin-woo Kim, Changwon-si (KR); Ju-hyun Ko, Yongin-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 179 days.

(21) Appl. No.: 15/686,317

(22) Filed: Aug. 25, 2017

(65) Prior Publication Data

US 2018/0082654 A1 Mar. 22, 2018

(30) Foreign Application Priority Data

Sep. 19, 2016 (KR) .................. 10-2016-0119555

(51) Int. Cl.
  *G09G 3/36* (2006.01)
  *H03F 3/30* (2006.01)
  *H03F 3/45* (2006.01)

(52) U.S. Cl.
  CPC ......... *G09G 3/3688* (2013.01); *G09G 3/3614* (2013.01); *H03F 3/303* (2013.01); *H03F 3/45192* (2013.01); *G09G 2310/0289* (2013.01); *G09G 2310/0291* (2013.01); *G09G 2310/08* (2013.01); *G09G 2320/0673* (2013.01); *H03F 3/45475* (2013.01)

(58) Field of Classification Search
  CPC ... G09G 2310/0289; G09G 2310/0291; G09G 2310/08; G09G 2320/0673; G09G 3/3614; G09G 3/3688; H03F 3/303; H03F 3/45192; H03F 3/45475
  See application file for complete search history.

(56) References Cited

U.S. PATENT DOCUMENTS

| | | |
|---|---|---|
| 6,441,763 B1 | 8/2002 | Nakao |
| 7,511,694 B2 | 3/2009 | Kim et al. |
| 7,956,779 B2 | 6/2011 | Chen et al. |

(Continued)

FOREIGN PATENT DOCUMENTS

JP 2001/313568 A 11/2001

*Primary Examiner* — Viet D Pham
(74) *Attorney, Agent, or Firm* — Harness, Dickey & Pierce, P.L.C.

(57) ABSTRACT

A source driver includes an interpolation amplifier configured to generate an interpolation voltage based on a received plurality of input voltages and output the interpolation voltage to a display panel; and an input selector configured to receive a first voltage and a second voltage having a different level from the first voltage, and configured to selectively provide at least one of the first and second voltages as the plurality of input voltages in response to some of the lower bits of pixel data. The interpolation amplifier includes four conductive differential input pairs configured to receive four input voltages from among the plurality of input voltages, respectively. Each of the first differential input pair and third differential input pair comprises a first type transistor. Each of the second differential input pair and fourth differential input pair comprises a second type transistor.

20 Claims, 17 Drawing Sheets

(56) References Cited

U.S. PATENT DOCUMENTS

| | | | |
|---|---|---|---|
| 7,994,837 B1* | 8/2011 | Ho | H03H 11/22 |
| | | | 327/231 |
| 8,471,633 B2 | 6/2013 | Tsuchi et al. | |
| 8,698,534 B1 | 4/2014 | Huang et al. | |
| 8,907,831 B1 | 12/2014 | Aftab | |
| 8,963,905 B2 | 2/2015 | Cho et al. | |
| 2005/0088329 A1* | 4/2005 | Tsuchi | G09G 3/3688 |
| | | | 341/144 |
| 2007/0216633 A1* | 9/2007 | Kim | G09G 3/2011 |
| | | | 345/100 |

* cited by examiner

FIG. 6

<TABLE 1>

| D[2:0] | Vin8 MP41 | Vin7 MN41 | Vin6 MP31 | Vin5 MN31 | Vin4 MP21 | Vin3 MN21 | Vin2 MP11 | Vin1 MN11 | VOUT |
|---|---|---|---|---|---|---|---|---|---|
| 000 | VL | VL | VL | VL | VL | VL | VL | VL | $8*VL/8=VL$ |
| 001 | VL | VL | VL | VL | VL | VL | VL | VH | $(7*VL+VH)/8$ |
| 010 | VL | VL | VL | VL | VL | VL | VH | VH | $(6*VL+2*VH)/8$ |
| 011 | VL | VL | VL | VL | VL | VH | VL | VH | $(5*VL+3*VH)/8$ |
| 100 | VL | VL | VL | VL | VH | VH | VH | VH | $(4*VL+4*VH)/8$ |
| 101 | VL | VL | VL | VH | VH | VH | VH | VL | $(3*VL+5*VH)/8$ |
| 110 | VL | VL | VH | VH | VH | VH | VH | VL | $(2*VL+6*VH)/8$ |
| 111 | VH | VH | VH | VH | VH | VH | VH | VL | $(VL+7*VH)/8$ |

FIG. 7

<TABLE 2>

| D[2:0] | Vin8 MP41 | Vin7 MN41 | Vin6 MP31 | Vin5 MN31 | Vin4 MP21 | Vin3 MN21 | Vin2 MP11 | Vin1 MN11 | VOUT |
|---|---|---|---|---|---|---|---|---|---|
| 000 | VL | VL | VL | VL | VL | VL | VL | VL | 8*VL/8=VL |
| 001 | VL | VL | VL | VL | VL | VL | VL | VH | (7*VL+VH)/8 |
| 010 | VL | VL | VL | VL | VL | VH | VL | VH | (6*VL+2*VH)/8 |
| 011 | VL | VL | VL | VH | VL | VH | VL | VH | (5*VL+3*VH)/8 |
| 100 | VL | VH | VL | VH | VL | VH | VL | VH | (4*VL+4*VH)/8 |
| 101 | VH | VH | VH | VL | VH | VL | VH | VL | (3*VL+5*VH)/8 |
| 110 | VH | VH | VH | VH | VH | VL | VH | VL | (2*VL+6*VH)/8 |
| 111 | VH | VH | VH | VH | VH | VH | VH | VL | (VL+7*VH)/8 |

FIG. 10

<TABLE 3>

| D[2:0] | Vin4 | | Vin3 | | | | Vin2 | Vin1 | VOUT |
|---|---|---|---|---|---|---|---|---|---|
| | MP41 | MN41 | MP31 | MN31 | MP21 | MN21 | MP11 | MN11 | |
| 000 | VL | VL | VL | VL | VL | VL | VL | VL | 8*VL/8=VL |
| 001 | VL | VL | VL | VL | VL | VL | VL | VH | (7*VL+VH)/8 |
| 010 | VL | VL | VL | VL | VL | VL | VH | VH | (6*VL+2*VH)/8 |
| 011 | VH | VH | VL | VL | VL | VL | VL | VH | (5*VL+3*VH)/8 |
| 100 | VL | VL | VH | VH | VH | VH | VH | VH | (4*VL+4*VH)/8 |
| 101 | VL | VL | VH | VH | VH | VH | VH | VL | (3*VL+5*VH)/8 |
| 110 | VL | VL | VH | VH | VH | VH | VH | VL | (2*VL+6*VH)/8 |
| 111 | VH | VH | VH | VH | VH | VH | VH | VL | (VL+7*VH)/8 |

FIG. 13

<TABLE 4>

| D[2:0] | Vin4 MP41 | Vin4 MN41 | Vin3 MP31 | Vin3 MN31 | Vin3 MP21 | Vin3 MN21 | PDEC Vin2 MP11 | PDEC Vin1 MN11 | NDEC Vin2 MP11 | NDEC Vin1 MN11 | VOUT |
|---|---|---|---|---|---|---|---|---|---|---|---|
| 000 | VL | VL | VL | VL | VL | VL | VL | VL | VL | VL | $8*VL/8 = VL$ |
| 001 | VL | VL | VL | VL | VL | VL | VH | VH | VH | VL | $(7*VL+VH)/8$ |
| 010 | VL | VL | VL | VL | VL | VL | VL | VH | VH | VH | $(6*VL+2*VH)/8$ |
| 011 | VH | VH | VL | VL | VL | VL | VH | VH | VH | VL | $(5*VL+3*VH)/8$ |
| 100 | VL | VL | VH | VH | VH | VH | VL | VL | VL | VL | $(4*VL+4*VH)/8$ |
| 101 | VL | VL | VH | VH | VH | VH | VH | VH | VL | VH | $(3*VL+5*VH)/8$ |
| 110 | VL | VL | VH | VH | VH | VH | VH | VL | VH | VH | $(2*VL+6*VH)/8$ |
| 111 | VH | VH | VH | VH | VH | VH | VH | VL | VL | VH | $(VL+7*VH)/8$ |

INTERPOLATION AMPLIFIER AND SOURCE DRIVER INCLUDING THE SAME

CROSS-REFERENCE TO RELATED APPLICATION

This application claims the benefit of Korean Patent Application No. 10-2016-0119555, filed on Sep. 19, 2016, in the Korean Intellectual Property Office, the disclosure of which is incorporated herein in its entirety by reference.

BACKGROUND

The inventive concepts relate to a semiconductor device, and more particularly, to a source driver driving a display panel and an interpolation amplifier included in the source driver.

A display device includes a display panel for displaying an image and a display driving circuit for driving the display panel. A source driver of the display driving circuit may drive the display panel by selecting a gamma voltage corresponding to a digital value of image data from among a plurality of gamma voltages and applying the selected gamma voltage to a source line of the display panel. Recently, as sizes and resolutions of display panels increase, the number of digital bits of image data increases. An area of a decoder circuit selecting a gamma voltage may be exponentially increased in proportion to the increased number of digital bits of the image data. Therefore, an amplifier interpolation scheme has been developed to reduce a circuit area. According to the amplifier interpolation scheme, representative gradation voltages are selected by upper bits of image data, and intermediate values of the selected representative gradation voltages are generated by the other lower bits.

SUMMARY

The inventive concepts provide an interpolation amplifier having a reduced circuit area and a reduced output voltage offset, and a source driver including the interpolation amplifier.

According to an aspect of the inventive concepts, there is provided a source driver including: an interpolation amplifier configured to generate an interpolation voltage based on a received plurality of input voltages and output the interpolation voltage to a display panel; and an input selector configured to receive a first voltage and a second voltage having a different level from the first voltage, and configured to selectively provide at least one of the first and second voltages as the plurality of input voltages in response to some of the lower bits of pixel data, wherein the interpolation amplifier includes: a first differential input pair configured to receive a first input voltage from among the plurality of input voltages; a second differential input pair configured to receive a second input voltage from among the plurality of input voltages; a third differential input pair configured to receive a third input voltage from among the plurality of input voltages; and a fourth differential input pair configured to receive a fourth input voltage from among the plurality of input voltages, wherein each of the first differential input pair and third differential input pair includes a first type transistor, and each of the second differential input pair and fourth differential input pair includes a second type transistor.

According to another aspect of the inventive concepts, there is provided a source driver including: a decoder configured to receive gamma voltages and output two voltages from among the gamma voltages as first and second voltages, wherein levels of the two voltages are adjacent to each other, in response to at least some of upper bits of pixel data of N bits (N is an integer of 4 or more); an input selector, in response to some of the lower bits of the pixel data, configured to selectively redundantly distribute the first and second voltages and output distributed voltages; and an interpolation amplifier including a plurality of input circuits having a rail-to-rail structure respectively including first and second conductive differential input pairs, wherein the first and second conductive differential input pairs in at least one of the plurality of input circuits respectively receive different voltages from among the distributed voltages output from the input selector.

According to another aspect of the inventive concepts, there is provided a source driver including a digital to analog converter, an input selector and an interpolation amplifier. The digital to analog converter includes a first decoder and a second decoder, the digital to analog converter configured to receive positive gamma voltages, negative gamma voltages, first pixel data and a polarity signal. The first decoder configured to select two negative gamma voltages based on the first pixel data. The second decoder configured to select two positive gamma voltages based on the first pixel data. The digital to analog converter is further configured to output two gamma voltages based on the polarity signal, the two gamma voltages being either the selected two negative gamma voltages or the selected two positive gamma voltages. The input selector configured to output a plurality of distributed voltages based on the two output gamma voltages, second pixel data and the polarity signal. The interpolation amplifier including a plurality of input circuits, the interpolation amplifier configured to output a plurality of output voltages based on the plurality of distributed voltages.

BRIEF DESCRIPTION OF THE DRAWINGS

Example embodiments of the inventive concepts will be more clearly understood from the following detailed description taken in conjunction with the accompanying drawings in which:

FIG. 6 is a table showing a relationship between input voltages corresponding to pixel data, according to an example embodiment of the inventive concepts;

FIG. 7 is a table showing a relationship between input voltages corresponding to pixel data, according to an example embodiment of the inventive concepts;

FIG. 10 is a table showing a relationship between input voltages corresponding to pixel data, in the interpolation driving circuit of FIG. 8;

FIG. 13 is a table showing a correspondence relationship between input voltages according to pixel data and a polarity signal, in the source driver of FIG. 11;

DETAILED DESCRIPTION OF THE EMBODIMENTS

Hereinafter, the present disclosure will be described in detail with reference to the accompanying drawings.

Figure 1:
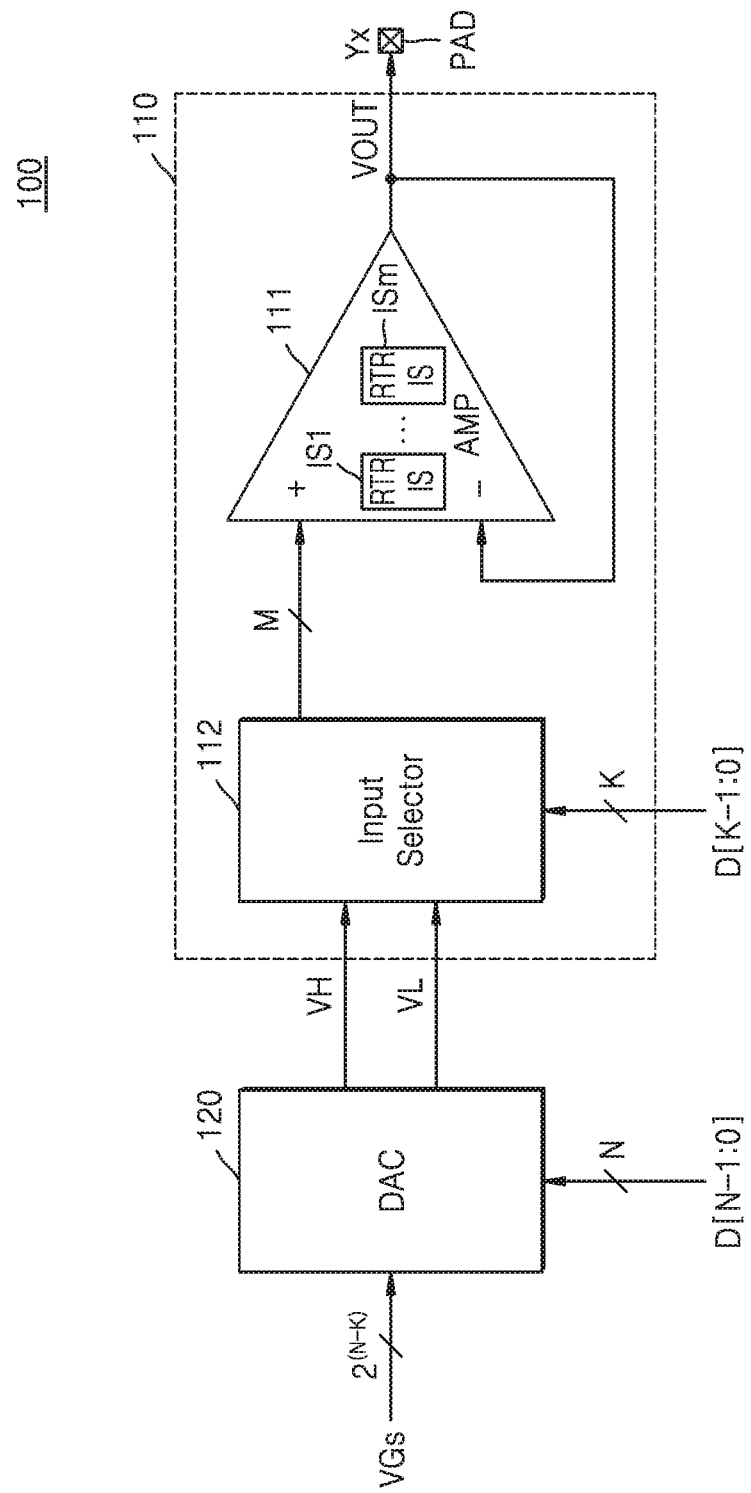
FIG. 1 is a block diagram of a source driver, according to an example embodiment of the inventive concepts.

FIG. 1 is a block diagram of a source driver, according to an example embodiment of the inventive concepts. An interpolation scheme of K bits may be applied to a source driver 100 of FIG. 1 based on the lower K bits (K is an integer of 2 or more, and less than N) of pixel data D[N−1:0] of N bits (N is an integer of 4 or more).

Referring to FIG. 1, the source driver 100 may include a digital-analog converter 120 and an interpolation driving circuit 110. The interpolation driving circuit 110 may include an interpolation amplifier 111 and an input selector 112. Although FIG. 1 shows a circuit (for example, a channel driving unit) for a source line output, but the source driver 100 may include a plurality of channel driving units to drive a plurality of source lines, as understood by those of ordinary skill in the art.

The digital-analog converter 120 may receive a plurality of gamma voltages VGs and the pixel data D[N−1:0] of N bits (for example, N is 6, 8 and 10), and may select two voltages from among the plurality of gamma voltages VGs in response to the pixel data D[N−1:0]. The digital-analog converter 120 may output the selected two voltages as a first voltage VL and a second voltage VH, respectively. The digital-analog converter 120 may be a decoder of N−K bits.

According to an example embodiment, the digital-analog converter 120 may receive $2^{(N-K)}$ gamma voltages VGs, and may select the first voltage VL and the second voltage VH in response to upper N-K bits of the pixel data D[N−1:0]. However, the inventive concepts is not limited thereto. The digital-analog converter 120 may receive $2^N$ or less gamma voltages VGs.

The first voltage VL and the second voltage VH may have adjacent levels to each other among plurality levels corresponding to the plurality of the gamma voltages VGs, and the level of the second voltage VH may be higher than the level of the first voltage VL. However, the inventive concepts are not limited thereto. The level of the first voltage VL may be higher than the level of the second voltage VH.

The interpolation driving circuit 110 may generate and output interpolation voltages of the first and second voltages VL and VH based on the lower K bits of the pixel data D[N−1:0] of N bits. For example, the interpolation driving circuit 110 may output $2^K$ interpolation voltages based on the first and second voltages VL and VH. According to an example embodiment, one of the interpolation voltages may be the first voltage VL. An interpolation voltage of the interpolation driving circuit 110, that is, an output voltage VOUT, may be output to a source line Yx of a display panel through an output pad PAD. The output voltage VOUT may be a gradation voltage corresponding to gradation of the pixel data D[N−1:0] of N bits.

The input selector 112 may selectively redundantly distribute the first and second voltages VL and VH according to a logical combination of the lower K bits (D[K−1:0]) of the pixel data D[N−1:0] of N bits, and may output M (M is an integer of 3 or more, and an integer of $2^K$ or less) distributed voltages. Therefore, the distributed voltages may be one of the first and second voltages VL and VH. The input selector 112 may be realized as 2 to M encoders.

The input selector 112 may provide the distributed voltages to the interpolation amplifier 111 as input voltages. According to an example embodiment, the input selector 112 may output $2^K$ distributed voltages. According to another example embodiment, the input selector 112 may output $2^K$ or less distributed voltages.

The interpolation amplifier 111 may receive and interpolate the distributed voltages output from the input selector 112 as input voltages, and thus, may generate $2^K$ output voltages VOUT. Each of the output voltages VOUT may be referred to as an interpolation voltage. The $2^K$ output voltages VOUT may include the first voltage VL and voltages between the first and second voltages VL and VH.

The interpolation amplifier 111 may have a plurality of non-inverted input terminals (+), and receive distributed voltages output from the input selector 112 to the interpolation amplifier 111 as a plurality of input voltages via the plurality of non-inverted input terminals (+) of the interpolation amplifier 111. An inverted input terminal (−) of the interpolation amplifier 111 is connected to an output terminal, and thus, the interpolation amplifier 111 may be operated as a buffer.

The interpolation amplifier 111 may include an input stage including m (m is $2^{K/2}$) input circuits IS1 through ISm having a rail-to-rail structure. Each of the input circuits IS1 through ISm having a rail-to-rail structure may include a first conductive differential input pair including a first conductive transistor and a second conductive differential input pair including a second conductive transistor. An input of the first conductive differential input pair is separated from an input of the second conductive differential input pair, and respective input voltages may be provided to the first and second conductive differential input pairs.

The first and second conductive transistors may be an n-channel metal-oxide-semiconductor (NMOS) transistor and a p-channel metal-oxide-semiconductor (PMOS) transistor, respectively. Alternatively, the first and second conductive transistors may be a PMOS transistor and an NMOS transistor, respectively. Hereinafter, for convenience of description, it will be assumed that the first and second conductive transistors are an NMOS transistor and a PMOS transistor, respectively.

The interpolation amplifier 111 may include $2^K$ differential input pairs, and may generate the $2^K$ output voltages VOUT based on input voltages provided to the differential input pairs. As described above, the input voltages may be one of the first and second voltages VL and VH, respectively. Therefore, the interpolation amplifier 111 may output interpolation voltages of the first and second voltages VL and VH.

Respective input voltages may be provided to a first conductive differential input pair and a second conductive differential input pair of at least one input circuit from among the input circuits IS1 through ISm. For example, the first voltage VL may be provided to the first conductive differential input pair and the second voltage VH may be provided to the second conductive differential input pair. A detailed operation of the connector 111 will be described in detail later below with reference to FIGS. 2 to 14.

For example, it will be described on an assumption that the source driver 100 receives pixel data of 10 bits and generates $2^{10}$ gradation voltages by applying an interpolation scheme based on the lower 3 bits of the pixel data. The digital-analog converter 120 may select two voltages from among $2^7$ gamma voltages VGs based on the upper 3 bits of the pixel data, and may output the selected voltages as the first and second voltages VL and VH. The input selector 112 may output a maximum of 8 distribution voltages respectively including one of the first and second voltages VL and VH according to a logical combination of upper 3 bits of the pixel data. The interpolation amplifier 111 may include four input circuits having a rail-to-rail structure, and accordingly, may include 8 differential input pairs. An identical input voltage or respective input voltages may be applied to the 8 differential input pairs, and therefore, the interpolation amplifier 111 may output one of the eight interpolation voltages as the output voltage VOUT.

The source driver 100 according to an example embodiment of the inventive concepts may reduce a circuit area of the digital-analog converter 120 by applying an interpolation scheme. When the interpolation scheme is applied, a general interpolation amplifier needs to have the increased number of input circuits of an input stage when the number of bits of the interpolation scheme increases, and thus, an area of a general interpolation amplifier may greatly increase. However, the interpolation amplifier 111 according to an example embodiment of the inventive concepts may separate an input of a first conductive differential input pair from an input of a second conductive differential input pair of input circuits having a rail-to-rail structure, in which respective input voltages are provided to the first and second conductive differential input pairs, and thus, both the number of input circuits having a rail-to-rail structure and an area of the interpolation amplifier 111 may be reduced.

Figure 2:
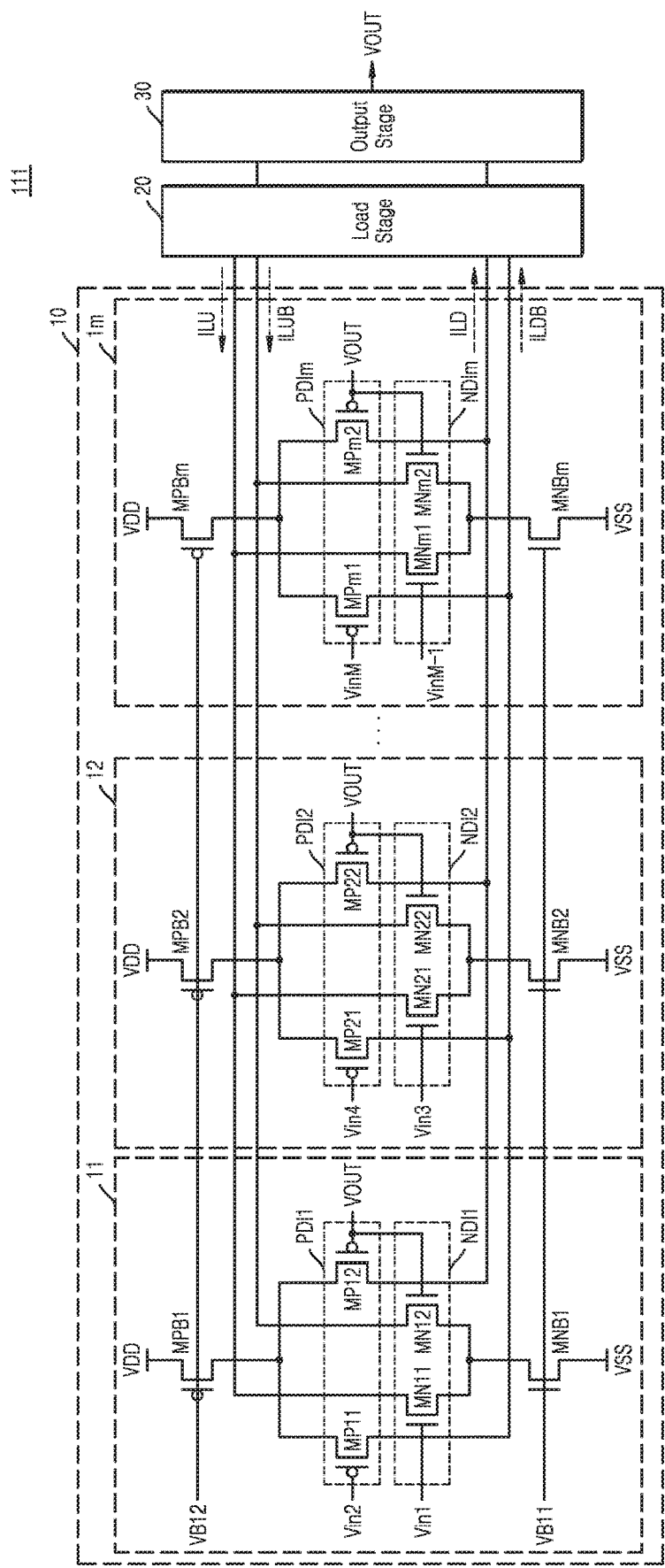
FIG. 2 is a circuit diagram of an input stage of an interpolation amplifier, according to an example embodiment of the inventive concepts.
Figure 3:
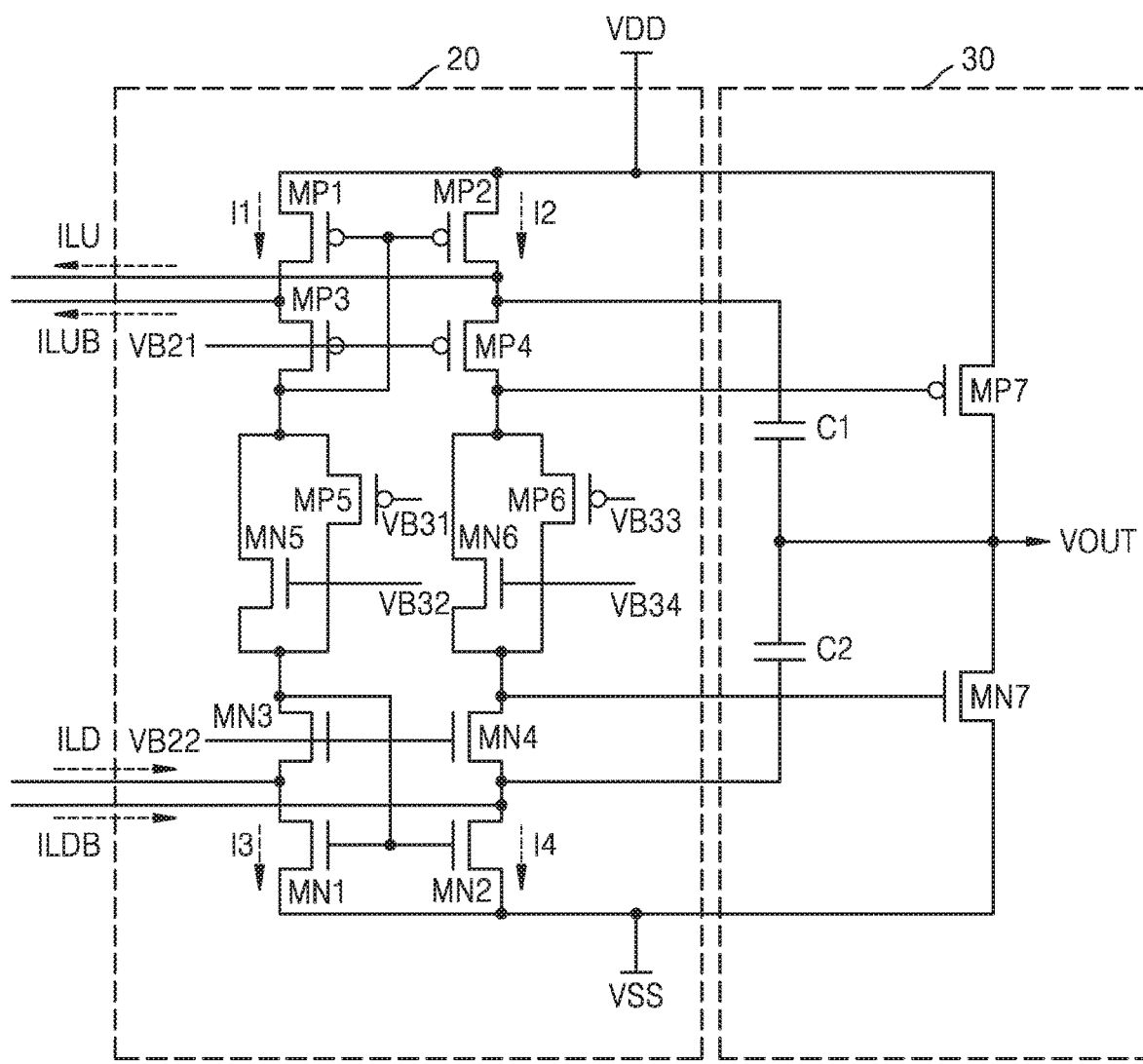
FIG. 3 is a circuit diagram of a load stage and an output stage of an interpolation amplifier, according to an example embodiment of the inventive concepts.

FIGS. 2 and 3 are circuit diagrams of an interpolation amplifier, according to an example embodiment of the inventive concepts. FIG. 2 is a circuit diagram of an input stage of an interpolation amplifier, and FIG. 3 is a circuit diagram showing an example of a load stage and an output stage of the interpolation amplifier, according to an example embodiment of the inventive concepts.

First, referring to FIG. 2, the interpolation amplifier 111 may include an input stage 10, a load stage 20, and an output stage 30. According to an example embodiment, the load stage 20 may be omitted.

The input stage 10 may receive input voltages Vin1 through VinM and an output voltage VOUT from the outside, and may determine a difference between the input voltages Vin1 through VinM and the output voltage VOUT. The input stage 10 may receive load currents ILU, ILUB, ILD, and ILDB according to the difference between the input voltages Vin1 through VinM and the output voltage VOUT from the load stage 20.

The input stage 10 may include a plurality of input circuits 11 through 1m. Although FIG. 2 shows that the input stage 10 includes three or more input circuits 11 through 1m, the inventive concepts is not limited thereto. The input stage 10 may include two input circuits.

Each of the plurality of input circuits 11 through 1m may have a rail-to-rail structure. For example, a first input circuit 11 may include a first conductive differential input pair NDI1 and a second conductive differential input pair PDI1, and a first current source MNB1 and a second current source MPB1 providing bias currents to the first and second differential input pairs NDI1 and PDI1, respectively.

Each of the first and second current sources MNB1 and MPB1 may generate a bias current based on each of a first bias voltage VB11 and a second bias voltage VB12. A slew rate of the interpolation amplifier 111 may be adjusted according to the bias current.

The first conductive differential input pair NDI1 may include first and second NMOS transistors MN11 and MN12, and the second conductive differential input pair PDI1 may include first and second PMOS transistors MP11 and MP12. Each of the first and second conductive differential input pairs NDI1 and PDI1 may receive one of the input voltages Vin1 through VinM. For example, the first NMOS transistor MN11 of the first conductive differential input pair NDI1 may receive a first input voltage Vin1. The first PMOS transistor MP11 of the second conductive differential input pair PDI1 may receive a second input voltage Vin2.

The second NMOS transistor MN12 of the first conductive differential input pair NDI1 and the second PMOS transistor MP12 of the second conductive differential input pair PDI1 may receive the output voltage VOUT of the interpolation amplifier 111.

A first conductive differential input pair NDI2 and a second conductive differential input pair PDI2 of a second input circuit 12 may respectively receive a third input voltage Vin3 and a fourth input voltage Vin4, and a first conductive differential input pair NDIm and a second conductive differential input pair PDIm of an mth input circuit 1m may respectively receive an (M−1)th input voltage VinM−1 and an Mth input voltage VinM. Here, M may be greater than m, and 2*m or less. Since structures and operations of the input circuits 12 through 1m are similar to those of the first input circuit 11, repeated descriptions thereof will not be given herein.

Bias currents provided by first current sources MNB1 through MNBm of a plurality of input circuits 11 through 1m may be the same, and bias currents provided by second current sources MPB1 through MPBm may be the same. Load currents ILU and ILUB received from the load stage 20 may be the same as a sum of the bias currents provided by the first current sources MNB1 through MNBm of the plurality of input circuits 11 through 1m, and load currents ILD and ILDB output to the load stage 20 may be the same as a sum of the bias currents provided by the second current sources MPB1 through MPBm of the plurality of input circuits 11 through 1m.

According to an embodiment of the inventive concepts, an input of a first conductive differential input pair of at least one input circuit from among the plurality of input circuits 11 through 1m is separated from an input of a second conductive differential input pair of the at least one input circuit, and respective input voltages may be provided to the first and second conductive differential input pairs. For example, the first and second conductive differential input pairs NDI1 and PDI1 of the first input circuit 11 from among the plurality of input circuits 11 through 1m may receive respective input voltages, for example, the first and second input voltages Vin1 and Vin2, as shown in FIG. 2.

Although FIG. 2 also shows that the first conductive differential input pairs NDI2 through NDIm and the second conductive differential input pairs PDI2 through PDIm of the second through mth input circuits 12 through 1m receive respective input voltages, the inventive concepts is not limited thereto. According to another example embodiment, a first conductive differential input pair and a second conductive differential input pair of at least one input circuit from among the second through mth input circuits 12 through 1m may receive an identical input voltage.

Referring to FIG. 3, for example, the load currents ILU, ILUB, ILD, and ILDB corresponding to the difference between the input voltages Vin1 through VinM and the output voltage VOUT may be generated and provided to the input stage 10. Therefore, the load stage 20 may receive and amplify signals output from the input stage 10. The load stage 20 may have a folded cascode structure and may perform an operation such as current mirroring. Currents I1, I2, I3 and I4 flowing in the load stage 20 may be controlled by a plurality of bias voltages VB21, VB22, VB31, V32, VB33, and VB34.

The output stage 30 may output the output voltage VOUT through an output terminal based on signals output from a middle stage MS. Capacitors C1 and C2 may be connected between the load stage 20 and the output terminal to stabilize the output voltage VOUT.

The load stage 20 and the output stage 30 are illustratively described with reference to FIG. 3. However, the inventive concepts is not limited thereto and circuits of the load stage 20 and output stage 30 may vary.

Figure 4:
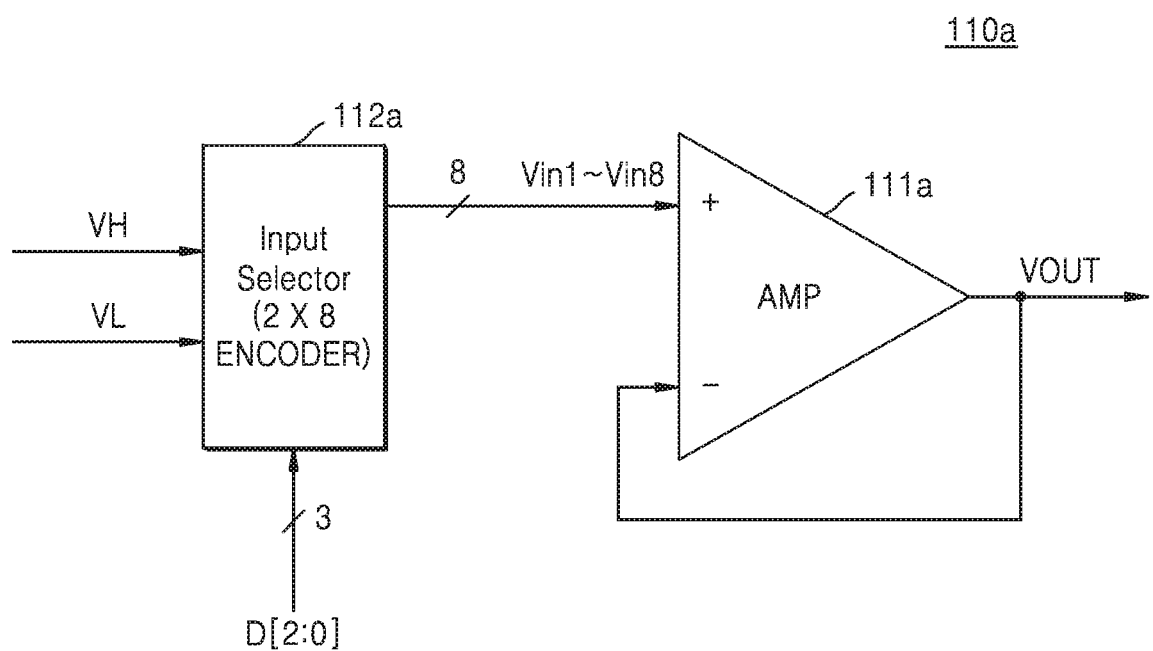
FIG. 4 is a block diagram showing an example of an interpolation driving circuit, according to an example embodiment of the inventive concepts.
Figure 5:
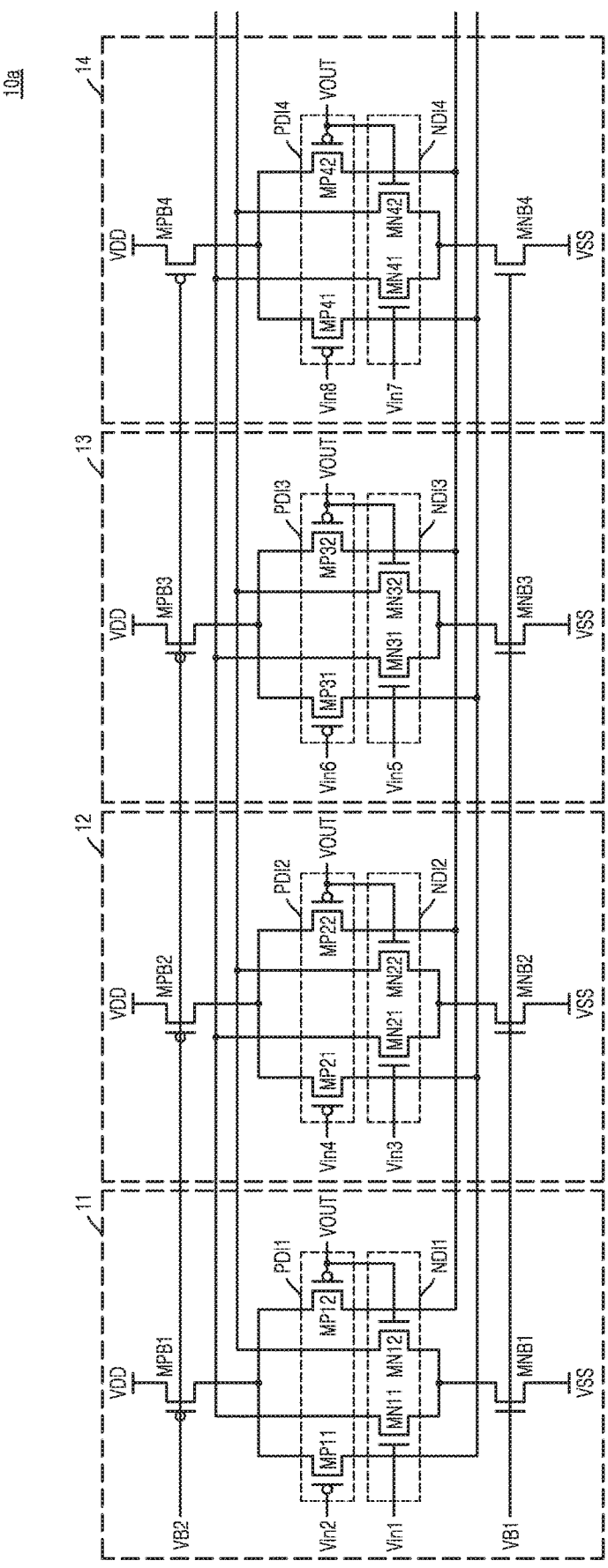
FIG. 5 is a circuit diagram of an input stage of an interpolation amplifier of FIG. 4.

FIG. 4 is a block diagram showing an example of an interpolation driving circuit, FIG. 5 is a circuit diagram of an input stage of an interpolation amplifier of FIG. 4, and FIG. 6 is a table showing a relationship between input voltages corresponding to pixel data in the interpolation driving circuit of FIG. 4, according to an example embodiment of the inventive concepts. FIG. 4 shows an example embodiment of the interpolation driving circuit 110 of FIG. 1, and the descriptions with reference to FIG. 1 may be applied to the present example embodiment.

Referring to FIG. 4, an interpolation driving circuit 110a may generate the output voltage VOUT based on the lower 3 bits D[2:0] of pixel data. For example, the interpolation driving circuit 110a may generate $2^3$, that is, eight output voltages VOUT. The interpolation driving circuit 110a may generate one of eight output voltages VOUT according to a value of the lower 3 bits D[2:0] of the pixel data.

An input selector 112a may be realized by 2 to 8 encoders, and may receive two voltages and output eight voltages based thereon. The input selector 112a may output eight voltages by selectively redundantly distributing the first and second voltages VL and VH provided by the digital-analog converter 120 (of FIG. 1) based on the lower 3 bits D[2:0] of the pixel data. The output eight voltages may be provided as first through eighth input voltages Vin1 through Vin8 of an interpolation amplifier 10a.

Referring to FIG. 5, the interpolation amplifier 10a may include four input circuits 11 to 14, and the input circuits 11 to 14 may have a rail-to-rail structure and may include first conductive differential input pairs NDI1 through NDI4 and second conductive differential input pairs PDI1 through PDI4, respectively. Each of the first conductive differential input pairs NDI1 through NDI4 and the second conductive differential input pairs PDI1 through PDI4 may receive one of the first through eighth input voltages Vin1 through Vin8.

According to a value of the lower 3 bits D[2:0] of the pixel data, the first through eighth input voltages Vin1 through Vin8 transmitted to the interpolation amplifier 10a and the output voltage VOUT output from the interpolation amplifier 10a may be changed.

Referring to Table 1 of FIG. 6, first through eighth input voltages Vin1 through Vin8 and output voltages VOUT may be determined according to values of the lower 3 bits D[2:0] of pixel data. Each of the first through eighth input voltages Vin1 through Vin8 may be one of first and second voltages VL and VH, and a level of the second voltage VH may be higher than a level of the first voltage VL. The first through eighth input voltages Vin1 through Vin8 may be provided to first NMOS transistors MN11 through MN41 of first conductive differential input pairs NDI1 through NDI4 (of FIG. 5) and first PMOS transistors MP11 through MP41 of second conductive differential input pairs PDI1 through PDI (of FIG. 5), respectively.

When a value of the lower 3 bits D[2:0] of the pixel data is '000', first voltages VL may be provided as the first through eighth input voltages Vin1 through Vin8. Accordingly, the output voltage VOUT may correspond to the first voltages VL.

When a value of the lower 3 bits D[2:0] of the pixel data is '001', one of second voltages VH may be provided as one of the first through eighth input voltages Vin1 through Vin8, and seven of first voltages VL may be provided as the other input voltages. Accordingly, the output voltage VOUT may correspond to a sum of ⅞ times the first voltages VL and ⅛ times the second voltages VH.

As such, as a value of the lower 3 bits D[2:0] of the pixel data increases, the number of the second voltages VH provided as the first through eighth input voltages Vin1 through Vin8 may increase, and a level of the output voltage VOUT may be higher.

When the least significant bit D[0] of pixel data is '0', that is, when the pixel data represents even-numbered gradation, the even number of first voltages VL1 and second voltages VH2 may be provided as the first through eighth input voltages Vin1 through Vin8, and a first conductive differential input pair and a second conductive differential input pair of an identical input circuit may receive an identical voltage. For example, first voltages VL or second voltages VH may be applied to the first NMOS transistor MN11 and the first PMOS transistor MP11 of the first input circuit 11.

When the least significant bit D[0] of pixel data is '1', that is, when the pixel data represents odd-numbered gradation, the odd number of first voltages VL1 and second voltages VH2 may be provided as the first through eighth input voltages Vin1 through Vin8, and a first conductive differential input pair and a second conductive differential input pair of an identical input circuit may receive different voltages. For example, second voltages VH may be applied to the first NMOS transistor MN11 of the first input circuit 11, and first voltages VL may be applied to the first PMOS transistor MP11. In this case, an offset may be generated in an output voltage VOUT due to mismatch of an NMOS transistor and a PMOS transistor.

The interpolation driving circuit 110a according to an example embodiment of the inventive concepts, when pixel data represents odd-numbered gradation, may provide second voltages VH as the first input voltage Vin1 if a value of the lower 3 bits D[2:0] of the pixel data is an intermediate value from among values represented by the lower 3 bits D[2:0] or less, and may provide second voltages VH as the second input voltage Vin2 if the value of the lower 3 bits D[2:0] of the pixel data is greater than the intermediate value. Accordingly, second voltages VH may be provided to an NMOS transistor if a value of the lower 3 bits D[2:0] of the pixel data is the intermediate value or less, and first voltages VL may be provided to an NMOS transistor if a value of the lower 3 bits D[2:0] of the pixel data is greater than the intermediate value. In FIG. 6, second voltages VH may be provided to the first NMOS transistor MN11 of the first input circuit 11 when a value of the lower 3 bits D[2:0] of the pixel data is '001' or '011', and first voltages VL may be provided to the first NMOS transistor MN11 of the first input circuit 11 when a value of the lower 3 bits D[2:0] of the pixel data is '101' or '111'. As such, it is determined whether the output voltage VOUT is close to second voltages VH or first voltages VL according to a value of the lower bits of pixel data, and accordingly, an offset of the output voltage VOUT may be minimized by a voltage provided to an NMOS transistor being changed.

A correspondence relationship between input voltages according to pixel data is described with reference to FIG. 6, but the inventive concepts are not limited thereto. The correspondence relationship between input voltages according to pixel data may vary. For example, a detailed description will be provided with respect to FIG. 7.

FIG. 7 is a table showing a relationship between input voltages corresponding to pixel data, according to an example embodiment of the inventive concepts.

Referring to Table 2 of FIG. 7, when a value of the lower bits of pixel data is an intermediate value or less, for example, when a value of the lower 3 bits D[2:0] of pixel data is '001' to '100', second voltages VH may be applied to at least one of the NMOS transistors MN11, MN21, and MN31 by providing second voltages VH to odd-numbered input voltages Vin1, Vin3, Vin5, and Vin7. Furthermore, when a value of the lower bits of pixel data is greater than an intermediate value, for example, when a value of the lower 3 bits D[2:0] of pixel data is '101' to '111', first voltages VL may be applied to at least one of the NMOS transistors MN11, MN21, and MN31 by providing first voltages VL to at least one of the odd-numbered input voltages Vin1, Vin3, Vin5, and Vin7.

Figure 8:
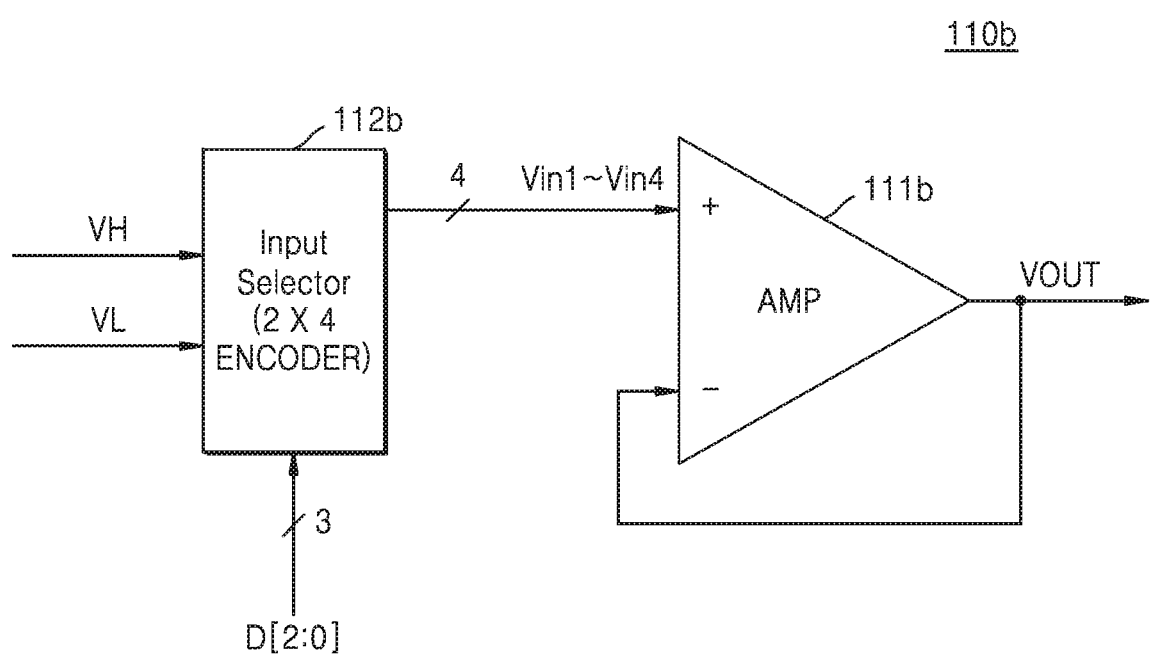
FIG. 8 is a block diagram showing an example of an interpolation driving circuit, according to an example embodiment of the inventive concepts.
Figure 9:
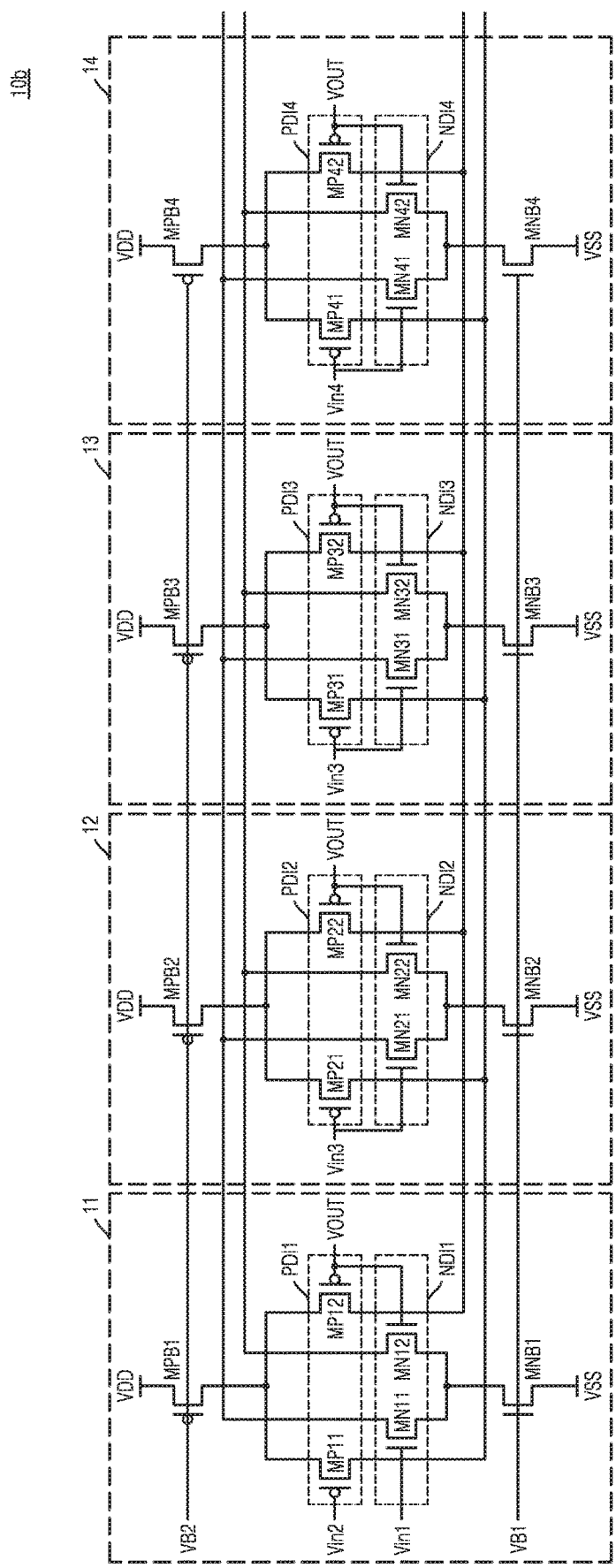
FIG. 9 is a circuit diagram of an input stage of an interpolation amplifier of FIG. 8.

FIG. 8 is a block diagram showing an example of an interpolation driving circuit, FIG. 9 is a circuit diagram of an input stage of an interpolation amplifier of FIG. 8, and FIG. 10 is a table showing a relationship between input voltages corresponding to pixel data in the interpolation driving circuit of FIG. 8, according to an example embodiment of the inventive concepts. FIG. 9 shows an example embodiment of the interpolation driving circuit 110 of FIG. 1, and the descriptions with reference to FIG. 1 may be applied to the present example embodiment.

An interpolation driving circuit 110b of FIG. 8 may generate eight interpolation voltages based on the lower 3 bits D[2:0] of pixel data. The interpolation driving circuit 110b may output one of the eight interpolation voltages as the output voltage VOUT according to a value of the lower 3 bits D[2:0] of the pixel data.

An input selector 112b may be realized by 2 to 4 encoders, and may receive two voltages and output four voltages based thereon. The input selector 112b may output four voltages by selectively redundantly distributing the first and second voltages VL and VH provided by the digital-analog converter 120 (of FIG. 1) based on the lower 3 bits D[2:0] of the pixel data. The output four voltages may be provided as first through fourth input voltages Vin1 through Vin4 of an interpolation amplifier 110b.

Referring to FIG. 9, the structure of the interpolation amplifier 110b is similar to the structure of the interpolation amplifier 10a of FIG. 5. However, in FIG. 9, inputs of the first and second conductive differential input pairs NDI1 and PDI1 of the first input circuit 11 are separated from each other and the first and second conductive differential input pairs NDI1 and PDI1 receive different input voltages, for example, the first and second input voltages Vin1 and Vin2, respectively. However, inputs of first and second conductive differential input pairs of the other input circuits 12, 13, and 14 may be connected to each other and the first and second conductive differential input pairs of the other input circuits 12, 13, and 14 may receive an identical input voltage, respectively. For example, the first conductive differential input pairs NDI2 and NDI3 and the second conductive differential input pairs PDI2 and PDI3 of the second and third input circuits 12 and 13 may receive the third input voltage Vin3, and the first and second conductive differential input pairs NDI4 and PDI4 of the fourth input circuit 14 may receive the fourth input voltage Vin4.

Although FIG. 9 shows that the second and third input circuits 12 and 13 receive an identical input voltage, for example, the third input voltage Vin3, the inventive concepts are not limited thereto and the second and third input circuits 12 and 13 may receive different input voltages.

For example, the input selector 112b (of FIG. 8) may be realized by 2 to 5 encoders and may receive two voltages, and may provide five voltages as first through fifth input voltages Vin1 through Vin5 of the interpolation amplifier 110b based thereon, and the second to fourth input circuits 12 to 14 may receive the third to fifth input voltages Vin3 to Vin5, respectively.

Referring to Table 3 of FIG. 10, when a value of the lower 3 bits D[2:0] of pixel data represents odd-numbered gradation, different voltages may be provided to the first NMOS transistor MN11 and the second PMOS transistor MP11 of the first input circuit 11 (of FIG. 9), respectively.

Since inputs of the second and third input circuits 12 and 13 are connected to each other and each of the second and third input circuits 12 and 13 receives the third input voltage Vin3 in FIG. 10, an identical input voltage may be applied to each of first NMOS transistors MN21 and MN31 and first PMOS transistors MP21 and MP31 of the second and third input circuits 12 and 13, according to a value of the lower 3 bits D[2:0] of pixel data. Therefore, when a value of the lower 3 bits D[2:0] of pixel data is '011', second voltages VH may be provided to the fourth input circuit 14 but not the second input circuit 12.

As described above with reference to FIG. 6, when pixel data represents odd-numbered gradation to minimize an offset of the output voltage VOUT due to mismatch of an NMOS transistor and a PMOS transistor, second voltages VH may be provided as the first input voltage Vin1 if a value of the lower 3 bits D[2:0] of the pixel data is an intermediate value or less (for example, '001' or '011'), and second voltages VH may be provided as the second input voltage Vin2 if a value of the lower 3 bits D[2:0] of the pixel data is greater than an intermediate value.

Figure 11:
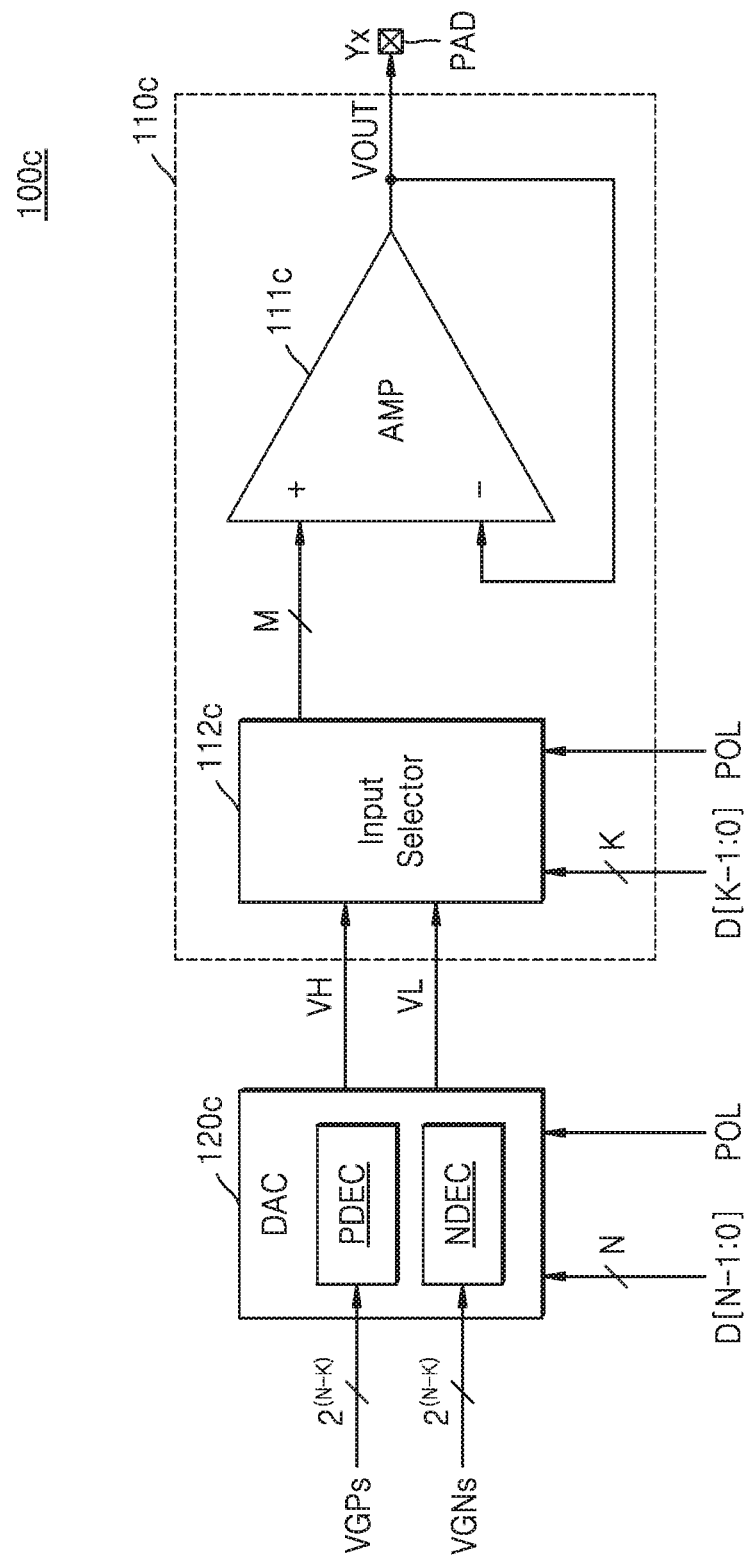
FIG. 11 is a block diagram of a source driver according to an embodiment of the inventive concepts.

FIG. 11 is a block diagram of a source driver according to an example embodiment of the inventive concepts.

Components and operations of a source driver 100c of FIG. 11 are similar to those of the source driver 100 of FIG. 1. However, since a digital-analog converter 120c and an input selector 112c of the source driver 100c operate in response to a polarity signal POL, an operation according to the polarity signal POL will be described in detail.

Referring to FIG. 11, the digital-analog converter 120c may include a first decoder NDEC and a second decoder PDEC. For example, the first decoder NDEC may be an N-type decoder and the second decoder may be a P-type decoder. The first decoder NDEC may receive negative gamma voltages VGNs and the second decoder PDEC may receive positive gamma voltages VGPs. Relationships between the positive gamma voltages VGPs and the negative gamma voltages VGNs and the polarity signal POL will be described in detail with reference to FIG. 12.

Figure 12:
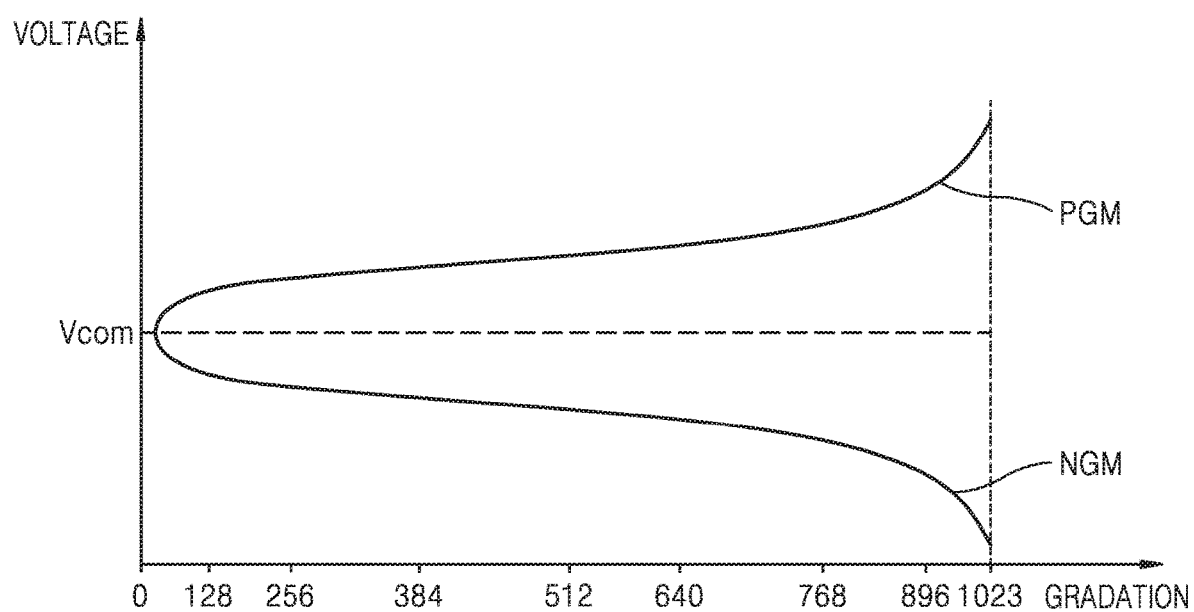
FIG. 12 is a graph showing gradation voltages according to gradation of pixel data.

FIG. 12 is a graph showing gradation voltages according to gradation of pixel data, in which a positive gamma curve PGM and a negative gamma curve NGM are illustrated.

When a display panel is a liquid crystal display (LCD), the source driver 100c may output a gradation voltage to the display panel at a higher level than a common voltage Vcom applied to the display panel or may output a gradation voltage to a display panel at a lower level than a common voltage Vcom applied to the display panel, in response to the polarity signal POL. A logic level of the polarity signal POL may be changed per frame or line of a display panel to prevent liquid crystal deterioration of an LCD and to improve quality of an image to be displayed.

The gradation voltage at a higher level than the common voltage Vcom may be referred to as a positive gradation voltage, and the gradation voltage at a lower level than the common voltage Vcom may be referred to as a negative gradation voltage. The positive gradation voltage and the negative gradation voltage may be generated based on positive gamma voltages PGNs according to the positive gamma curve PGM and negative gamma voltages VGNs according to the negative gamma curve NGM.

The positive gamma curve PGM and the negative gamma curve NGM may be symmetrical to each other around the common voltage Vcom. The positive gamma voltages VGPs may be generated corresponding to the positive gamma curve PGM, and the negative gamma voltages VGNs may be generated corresponding to the negative gamma curve NGM.

The source driver 100c may output negative gradation voltages according to the negative gamma voltages VGNs when the polarity signal POL is at a first logic level, for example, logic low, and may output positive gradation voltages according to the positive gamma curve PGM when the polarity signal POL is at a second logic level, for example, logic high.

Referring again to FIG. 11, the first decoder NDEC may select two voltages from among the negative gamma voltages VGNs based on a polarity signal POL having pixel data D[N−1:0] and at a first logic level, for example, logic low, and may output the selected voltages as first and second voltages VL and VH, respectively. The second decoder PDEC may select two voltages from among the positive gamma voltages VGPs based on a polarity signal POL having pixel data D[N−1:0] and at a second logic level, for example, logic high, and may output the selected voltages as the first and second voltages VL and VH, respectively.

The input selector 112c may selectively redundantly distribute the first and second voltages VL and VH according to a logical combination of the lower K bits (D[K−1:0]) of the pixel data D[N−1:0] of N bits, and may output M (M is an integer of 3 or more, and an integer of $2^K$ or less) distributed voltages. Here, the input selector 112c may output M distributed voltages in response to a polarity signal POL, wherein M distributed voltages output according to a polarity signal POL at a first logic level may be different from M distributed voltages output according to a polarity signal POL at a second logic level. Therefore, input voltages of an interpolation amplifier 111c may vary according to a polarity signal POL even having identical lower K bits (D[K−1:0]) of the pixel data D[N−1:0].

FIG. 13 is a table showing a correspondence relationship between input voltages according to pixel data and a polarity signal, in the source driver 100c of FIG. 11. FIG. 13, for example, shows that the interpolation driving circuit 110b of FIG. 8 is applied to the interpolation driving circuit 110c of FIG. 11.

Referring to Table 4 of FIG. 13, when pixel data represents odd-numbered gradation (for example, when the least significant bit D[0] of pixel data is '1'), the first and second input voltages Vin1 and Vin2 may vary according to a polarity signal POL. First and second voltages VL and VH may be output from the first decoder NDEC when a polarity signal POL is at a first logic level, and first and second voltages VL and VH may be output from the second decoder PDEC when a polarity signal POL is at a second logic level. When pixel data represents odd-numbered gradation, as shown in FIG. 14, a voltage provided as the first input voltage Vin1 and a voltage provided as the second input voltage Vin2 may be switched according to a polarity signal.

Figure 14:
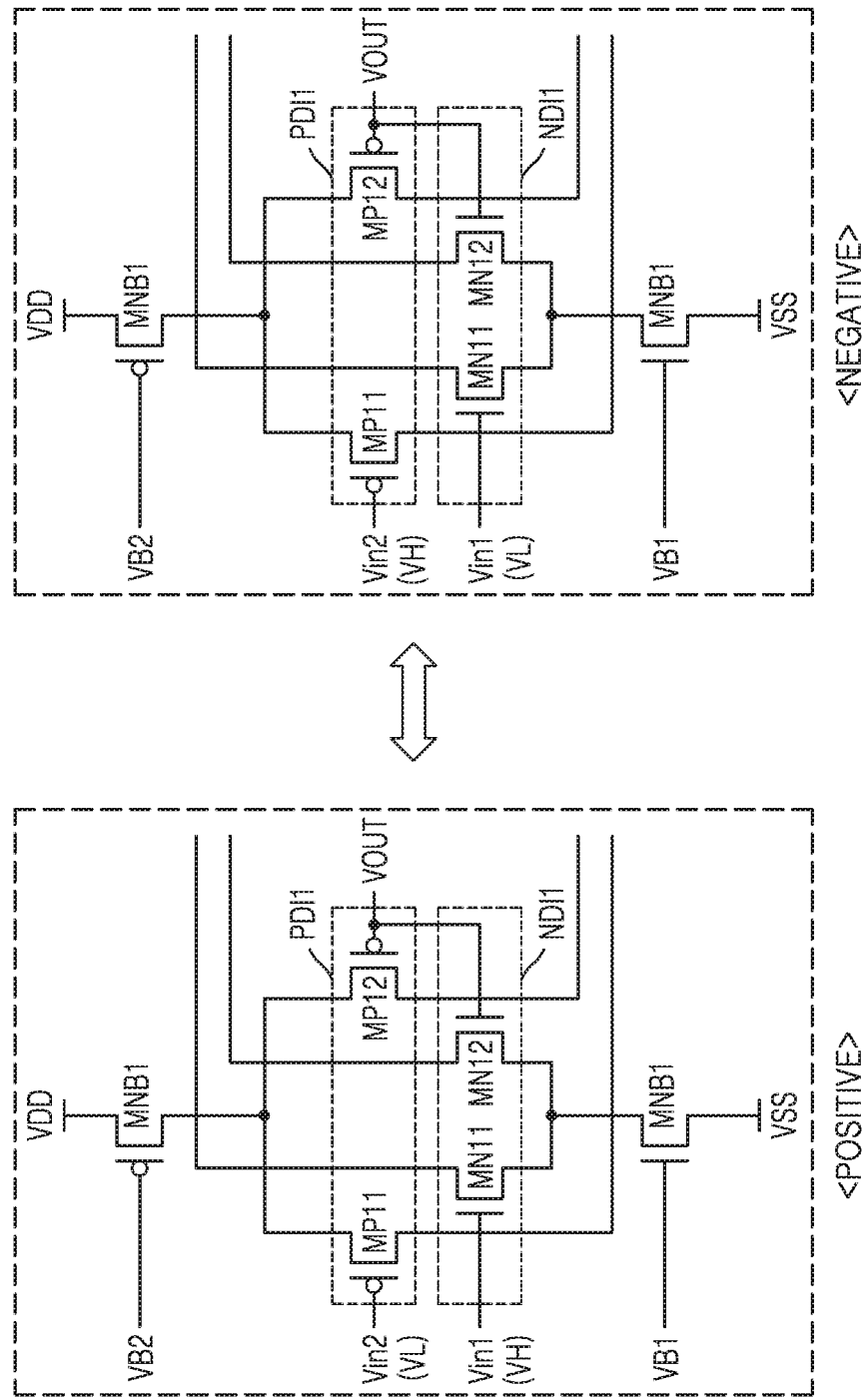
FIG. 14 is an exemplary view of an input voltage applied to an input circuit according to a polarity signal, in an interpolation amplifier according to an example embodiment of the inventive concepts.

FIG. 14 is an exemplary view of an input voltage applied to an input circuit according to a polarity signal, in an interpolation amplifier according to an example embodiment of the inventive concepts.

Referring to FIG. 14, the first input circuit 11 of the interpolation amplifier 111c (of FIG. 11) may receive the first and second input voltages Vin1 and Vin2. The first input voltage Vin1 may be provided to the first conductive differential input pair NDI1, and the second input voltage Vin2 may be provided to the second conductive differential input pair PDI1.

If a second voltage VH is provided as the first input voltage Vin1 and a first voltage VL is provided as the second input voltage Vin2 when a polarity signal POL is at a second logic level (for example, POSITIVE), the first voltage VL may be provided as the first input voltage Vin1 and the second voltage VH may be provided as the second input voltage Vin2 when a polarity signal POL is at a first logic level (for example, NEGATIVE). Therefore, voltages applied to the first and second conductive differential input pairs NDI1 and PDI1 may be switched according to a polarity signal POL.

Since a logic level of a polarity signal POL changes per frame or line, an offset of the output voltage VOUT is temporally averaged, and thus, a visual offset of the output voltage VOUT may be reduced.

Components and operations of a source driver according to an example embodiment of the inventive concepts are described above with reference to FIGS. 1 through 14. A specific example embodiment describes the source driver 100 to which an interpolation scheme of 3 bits is applied as an example, but the inventive concepts is not limited thereto. An interpolation scheme of 2 bits or 4 bits or more may be applied to the source driver 100. For example, when an interpolation scheme of 2 bits is applied to the source driver 100, the interpolation amplifier 111 may include two input circuits having a rail-to-rail structure. A combination of input voltages applied to the two input circuits may be variously derived according to the example embodiments of the inventive concepts described above, as understood by those of ordinary skill in the art and thus repeated descriptions thereof will not be given herein.

Figure 15:
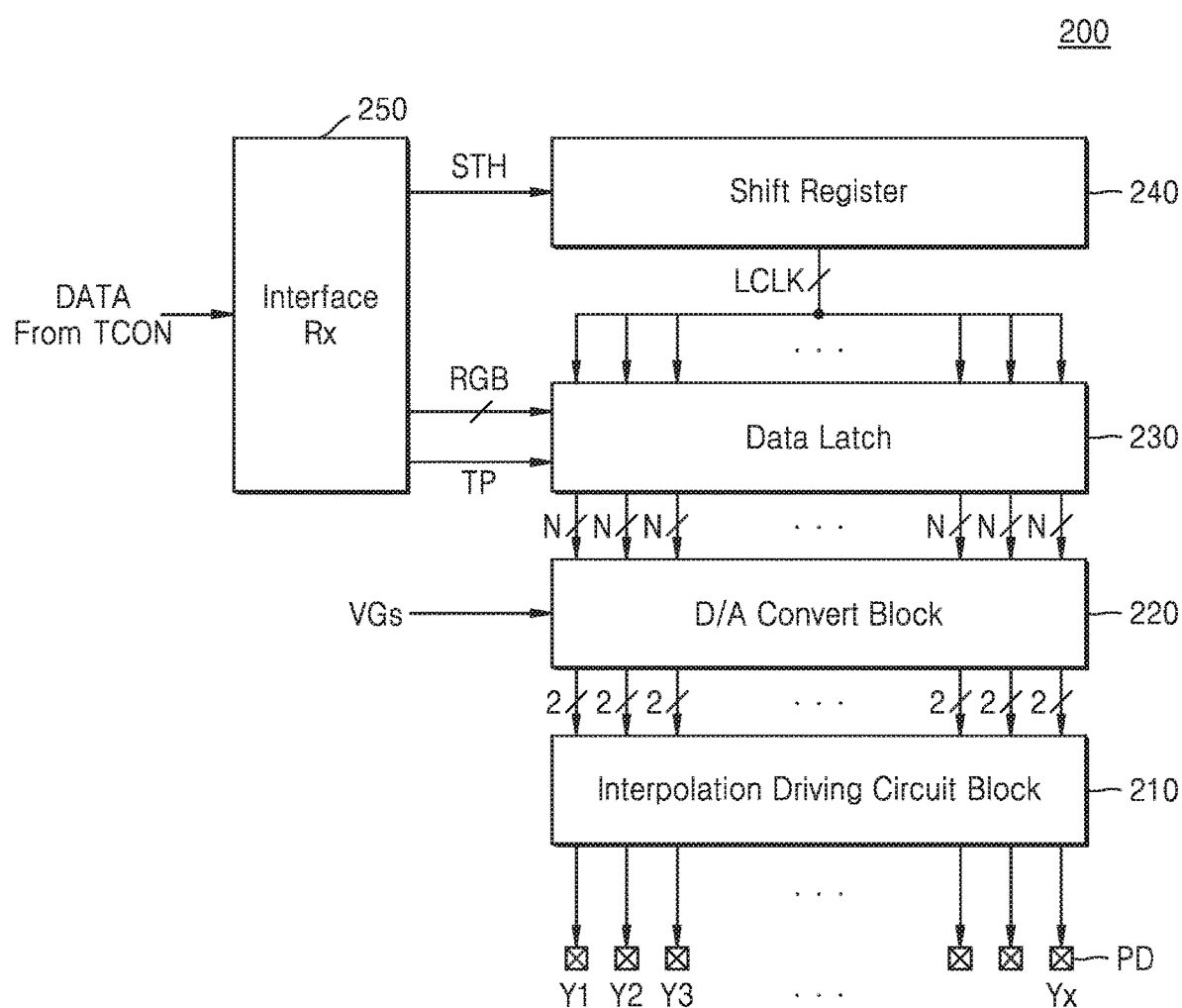
FIG. 15 is a block diagram of a source driver according to an embodiment of the inventive concepts.

FIG. 15 is a block diagram of a source driver according to an example embodiment of the inventive concepts.

Referring to FIG. 15, a source driver 200 may include an interface 250, a shift register 240, a data latch 230, a digital-analog convert block 220, and an interpolation driving circuit block 210. The source driver 200 may further include a control logic. Each of the digital-analog convert block 220 and the interpolation driving circuit block 210 may include configurations of the source drivers 100 and 100c of FIGS. 1 and 11. According to an example embodiment, the source driver 200 of FIG. 15 may be realized by a source driving chip.

The interface 250 may receive data DATA from the outside, for example, a timing controller TCON. The interface 250 may receive the data DATA from the timing controller TCON according to a set interface method. The data DATA may include pixel data and a control signal. According to an example embodiment, the interface 250 may receive packet-type data DATA.

The interface method may be one of a universal serial interface (USI), a central processing unit (CPU) interface, a red-green-blue (RGB) interface, a mobile industry processor interface (MIPI), a mobile display digital interface (MDDI), a compact display port (CDP), a mobile pixel link (MPL), a current mode advanced differential signaling (CMADS), a serial peripheral interface (SPI), an inter-integrated circuit (I2C) interface, a display-port (DP) and an embedded display-port (eDP) interface, a camera control interface (CCI), a camera serial interface (CSI), a micro controller unit (MCU) interface, a high-definition multimedia interface (HDMI), and an intra-panel interface (IPI). Besides the interface methods above, the interface method may be one of various high-speed serial interface methods.

The interface 250 may restore pixel data RGB per line and control signals, for example, vertical synchronization signals STH, load signals TP, and clock signals based on received data DATA, and may provide the restored signals to other components of the source driver 200. According to an example embodiment, the source driver 200 may further include a control logic generating the control signals.

The shift register 240 controls a timing when the pixel data RGB is sequentially stored in the data latch block 230. The shift register 240 may sequentially shift the vertical synchronization start signals STH and generate shifted clock signals, for example, latch clock signals LCLK, and may provide the latch clock signals LCLK to the data latch block 230.

The data latch block 230 includes a plurality of latch circuits and sequentially stores pixel data RGB corresponding to a horizontal line from one end of the latch circuits to the other end of the same based on the latch clock signals LCLK output from the shift register 240. The data latch block 230, after storing the pixel data RGB, may output the pixel data RGB in response to the load signals TP.

The digital-analog converter block 220 may receive the pixel data RGB of N bits output from the data latch block 230, and may output two gamma voltages corresponding to the pixel data RGB from among received gamma voltages VGs. As described above with reference to FIG. 1, the digital-analog converter 120 (of FIG. 1) included in the digital-analog converter block 220 may select two gamma voltages from among the gamma voltages VGs in response to some of upper bits from among the pixel data of N bits, and may output the selected gamma voltages.

The gamma voltages VGs may be received from the outside of the source driver 200, for example, an external gamma voltage generating circuit. According to another example embodiment, the source driver 200 may further include a gamma voltage generator and may generate the gamma voltages VGs.

The interpolation driving circuit block 210 may generate $2^K$ output voltages, for example, interpolation voltages by applying an interpolation scheme of K bits based on the lower K bits of pixel data of N bits. A plurality of interpolation amplifiers included in the interpolation driving circuit block 210 may include $2^{K/2}$ input circuits having a rail-to-rail structure, and each of the input circuits may include first and second conductive differential input pairs. An input of the first conductive differential input pair may be separated from an input of the second conductive differential input pair in at least one of the $2^{K/2}$ input circuits, and different input voltages may be provided to the first and second conductive differential input pairs, respectively.

The interpolation driving circuit block 210 may provide a plurality of output voltages to each of source lines Y1 through Yx of a display panel through a pad PD.

Figure 16:
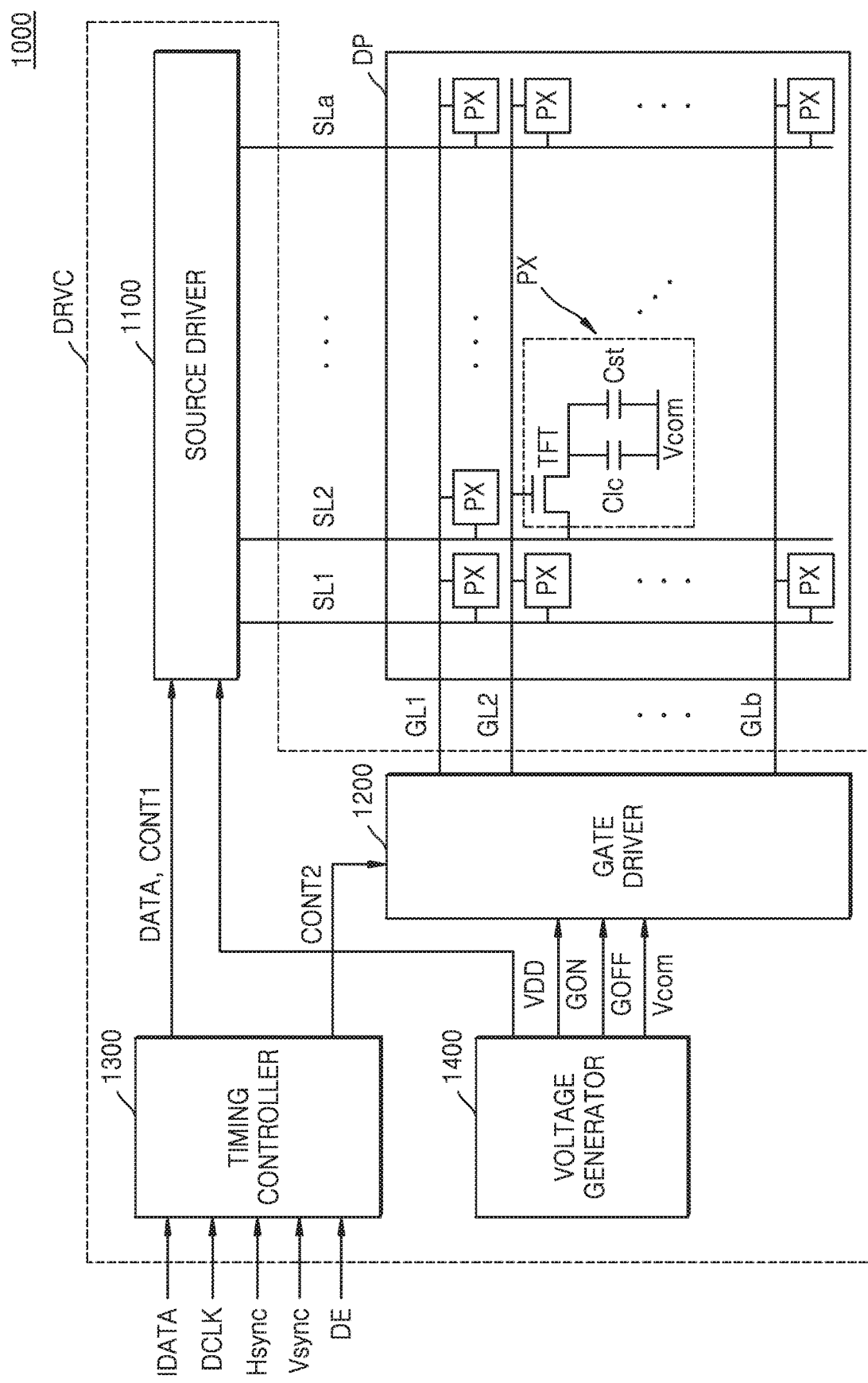
FIG. 16 is a block diagram of a display device according to an embodiment of the inventive concepts.

FIG. 16 is a block diagram of a display device 1000 according to an example embodiment of the inventive concepts.

Referring to FIG. 16, the display device 1000 includes a display panel DP and a driving circuit DRVC.

The display panel DP may display an image in a frame unit. The display panel DP may embodied as an LCD, a light emitting diode (LED) display, an organic light-emitting diode (OLED) display, an active-matrix OLED (AMOLED) display, and a flexible display and may be a flat panel display of other types. For convenience, the display panel DP is an LCD panel.

The display panel DP includes first to bth gate lines GL1 to GLb arranged in a row direction, first to ath source lines SL1 to SLa arranged in a column direction, and pixels PX formed at intersection points where the first to bth gate lines GL1 to GLb intersect the first to ath source lines SL1 to SLa. As described with reference to FIG. 16, in the display panel DP, each of the pixels PX includes a thin film transistor (TFT), a liquid crystal capacitor Clc and a storage capacitor Cst connected to a drain of the TFT. A common voltage Vcom may be connected to the other end of the liquid crystal capacitor Clc and the storage capacitor Cst. When the first to bth gate lines GL1 to GLb are sequentially scanned, a TFT of a pixel PX connected to a selected gate line is turned on and a gradation voltage corresponding to pixel data is applied to each of the first to ath source lines SL1 to SLa. The gradation voltage is applied to the liquid crystal capacitor Clc and the storage capacitor Cst via a TFT of corresponding pixel PX, and a display operation is performed as the liquid crystal capacitor Clc and the storage capacitor Cst are driven.

The driving circuit DRVC may include a source driver 1100, a gate driver 1200, a timing controller 1300, and a voltage generator 1400. The driving circuit DRVC may be realized by a semiconductor chip or a plurality of semiconductor chips.

The timing controller 1300 may receive image data IDATA and a plurality of control signals, for example, a horizontal synchronization signal Hsync, a vertical synchronization signal Vsync, a clock signal DCLK, and a data enable signal DE from an external device (for example, a host device (not shown)), and may generate a first control signal CNT1 and a second control signal CNT2 to control the gate driver 1200 and the source driver 1100 based on the plurality of control signals. The first control signal CNT1 may be a control signal corresponding to the source driver 1100 and the second control signal CNT2 may be a control signal corresponding to the gate driver 1200.

Furthermore, the timing controller 1300 may generate data DATA by converting the format of the image data IDATA from the outside according to interface specifications with respect to the source driver 1100, and may transmit the data DATA to the source driver 1100.

The gate driver 1200 and the source driver 1100 may drive the pixels PX of the display panel DP according to the first and second control signals CNT1 and CNT2 provided from the timing controller 1300.

The source driver 1100 drives the first to ath source lines SL1 to SLa of the display panel DP based on the first control signal CNT1. The source driver 1100 may output a gradation voltage corresponding to pixel data to the first to ath source lines SL1 to SLa of the display panel DP. In the present example embodiment, the source driver 1100 may be the same as the source drivers 100, 100*c*, and 200 of FIGS. 1, 10 and 15. The source driver 1100 may generate a plurality of gradation voltages by applying an interpolation scheme of K bits based on a plurality of gamma voltages.

Figure 17:
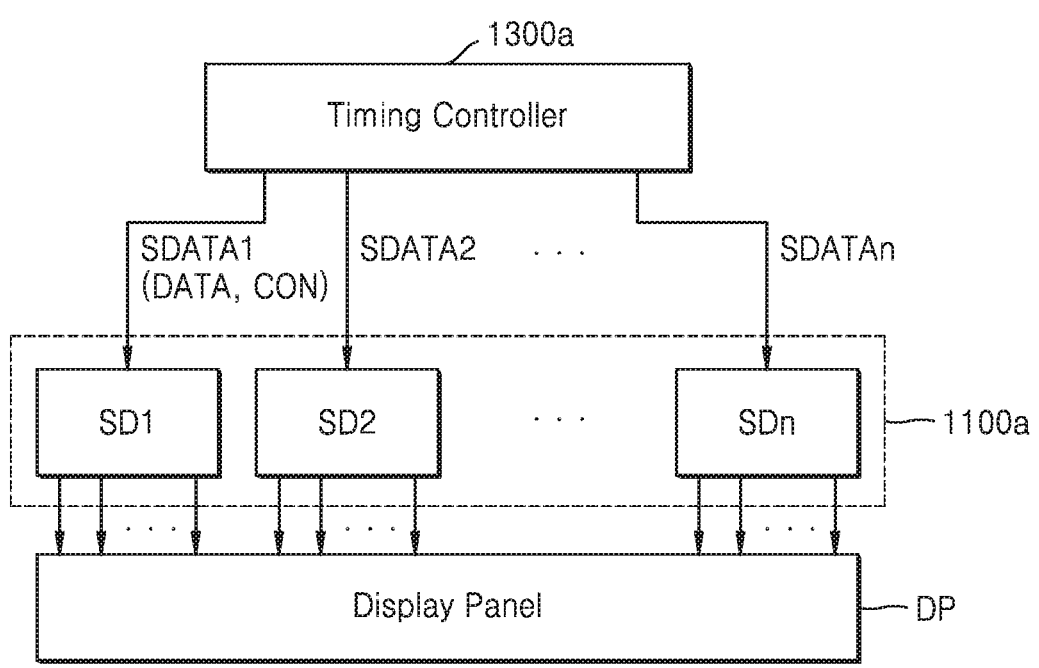
FIG. 17 is a block diagram of a source driver including a plurality of driving chips.

The source driver 1100 may include a single chip, or may include a plurality of source driving chips SD1 to SDn, as shown in FIG. 17. Here, the timing controller 1300 may divide the image data IDATA from the outside into pieces of source data SDATA1 to SDATAn according to an area of the display panel DP driven by each of the source driving chips SD1 to SDn, and may transmit the divided pieces of source data SDATA1 to SDATAn to the corresponding source driving chips SD1 to SDn, respectively. Furthermore, the timing controller 1300 may transmit corresponding control signals together with the pieces of source data SDATA1 to SDATAn to the source driving chips SD1 to SDn, respectively.

The gate driver 1200 sequentially scans the first to bth gate lines GL1 to GLb of the display panel DP. The gate driver 1200 activates a selected gate line by applying a gate-on voltage GON to the selected gate line, and the source driver 1100 outputs a gradation voltage corresponding to pixels PX connected to the activated gate line. Therefore, the display panel DP may display an image by horizontal line units, that is, per line.

The voltage generator 1400 generates voltages used by the driving circuit DRVC and the display panel DP. The voltage generator 1400 may generate the gate-on voltage GON, a gate-off voltage GOFF, the common voltage Vcom, and a power voltage VDD. The gate-on voltage GON and the gate-off voltage GOFF are provided to the gate driver 1200 and used to generate gate signals applied to the first to bth gate lines GL1 to GLb. The common voltage Vcom is commonly provided to the pixels PX of the display panel DP. As illustrated in FIG. 16, the common voltage Vcom may be provided to one end of the liquid crystal capacitor Clc and the storage capacitor Cst.

The display device 1000 according to an example embodiment of the inventive concepts may be mounted on various electronic devices having an image display function. Examples of an electronic device may include at least one of a television (TV), a digital video disk (DVD) player, an audio player, a refrigerator, an air conditioner, a smart phone, a tablet personal computer (PC), a mobile phone, a video phone, an e-book reader, a desktop computer, a laptop computer, a netbook computer, a personal digital assistant (PDA), a portable multimedia player (PMP), an MP3 player, a mobile medical instrument, a camera, and a wearable device (e.g., a head-mounted device (HMD) such as electronic glasses, smart garments, a smart bracelet, a smart necklace, an electronic appcessary, electronic tattoos, a smart watch, or the like). Furthermore, other examples of an electronic device may include one of various medical devices, a navigation device, a global positioning system (GPS) receiver, and an automatic teller's machine (ATM). The electronic device may be one of the above-described devices or a combination thereof. Also, the display device 1000 may be a flexible device.

While the inventive concepts have been particularly shown and described with reference to example embodiments thereof, it will be understood that various changes in form and details may be made therein without departing from the spirit and scope of the following claims.

What is claimed is:

1. A source driver comprising:
an interpolation amplifier configured to generate an interpolation voltage based on a received plurality of input voltages and output the interpolation voltage to a display panel; and
an input selector configured to
receive a first voltage, a second voltage having a different voltage level from the first voltage, and at least lower bits of pixel data having bits, and
selectively provide at least one of the first and second voltages as the plurality of input voltages in response to the lower bits of the pixel data, wherein the interpolation amplifier includes,
a first differential input pair configured to receive a first input voltage from among the plurality of input voltages,
a second differential input pair configured to receive a second input voltage from among the plurality of input voltages,
a third differential input pair configured to receive a third input voltage from among the plurality of input voltages, and
a fourth differential input pair configured to receive a fourth input voltage from among the plurality of input voltages, each of the first differential input pair and third differential input pair includes a first type transistor, and each of the second differential input pair and fourth differential input pair includes a second type transistor.

2. The source driver of claim 1, wherein
the first and second differential input pairs constitute a first input circuit from among a plurality of input circuits having a rail-to-rail structure,
the third and fourth differential input pairs constitute a second input circuit from among the plurality of input circuits, and
the first, second, third and fourth voltages are independent from one another.

3. The source driver of claim 1, wherein,
when a least significant bit of the pixel data is at a first logic level, the input selector provides one of the first and second voltages as the first input voltage and provides the other one of the first and second voltages as the second input voltage.

4. The source driver of claim 3, wherein,
when the least significant bit of the pixel data is at a second logic level, the input selector provides one of the first and second voltages as the first and second input voltages.

5. The source driver of claim 1, wherein
the input selector provides one of the first and second voltages as the third and fourth input voltages.

6. The source driver of claim 1, wherein
when a least significant bit of the pixel data is at a first logic level, the input selector provides the second voltage as the first input voltage if values of some of the bits of the pixel data are less than an intermediate value of the some of the bits, and provides the first voltage as the first input voltage when values of the some of the bits are greater than the intermediate value.

7. The source driver of claim 6, wherein the first type transistor is an n-channel metal-oxide-semiconductor (NMOS) transistor, and the second type transistor is a p-channel metal-oxide-semiconductor (PMOS) transistor, wherein a level of the second voltage is higher than a level of the first voltage.

8. The source driver of claim 1, wherein the input selector provides the first voltage as the first input voltage and provides the second voltage as the second input voltage when a polarity signal is at a first logic level, and provides the first voltage as the first input voltage and provides the second voltage as the second input voltage when the polarity signal is at a second logic level.

9. The source driver of claim 8, wherein a logic level of the polarity signal is switched per frame of the display panel or per line of the frame.

10. The source driver of claim 8, further comprising: a first decoder configured to output the first and second voltages based on first gamma reference voltages within a first voltage range and a second decoder configured to output the first and second voltages based on second gamma reference voltages within a second voltage range different from the first voltage range, wherein the first decoder outputs the first and second voltages when the polarity signal is at the first logic level and the second decoder outputs the first and second voltages when the polarity signal is at the second logic level.

11. The source driver of claim 1, wherein the interpolation amplifier further includes fifth to eighth differential input pairs configured to respectively receive fifth to eighth input voltages from among the plurality of input voltages.

12. A source driver comprising:
a decoder configured to
receive gamma voltages and pixel data, the pixel data having N bits, N being an integer equal to, or greater than, 4 and
output two voltages from among the gamma voltages as first and second voltages in response to at least some of upper bits of the pixel data, voltage levels of the two voltages being adjacent to each other;
an input selector, in response to some of the lower bits of the pixel data, configured to selectively redundantly distribute the first and second voltages and output distributed voltages; and
an interpolation amplifier comprising a plurality of input circuits respectively comprising first and second conductive differential input pairs, the plurality of input circuits having a rail to rail structure, the first and second conductive differential input pairs in at least one of the plurality of input circuits respectively receive different voltages from among the distributed voltages output from the input selector.

13. The source driver of claim 12, wherein the interpolation amplifier generates one of $2^K$ interpolation voltages, and comprises m input circuits, K being an integer of 2 or more, and less than N, m being $(2^K)/2$.

14. The source driver of claim 13, wherein the input selector outputs the distributed voltages in response to lower K bits (K is an integer of 2 or more, and less than N) of the pixel data.

15. The source driver of claim 12, wherein the first and second conductive differential input pairs in at least one other input circuit from among the plurality of input circuits receive one of the distributed voltages.

16. A source driver comprising:
a digital to analog converter including a first decoder and a second decoder, the digital to analog converter configured to receive positive gamma voltages, negative gamma voltages, first pixel data and a polarity signal, the first decoder configured to
select two negative gamma voltages based on the first pixel data, the second decoder configured to select two positive gamma voltages based on the first pixel data,
the digital to analog converter is further configured to output two gamma voltages based on the polarity signal, the two gamma voltages being either the selected two negative gamma voltages or the selected two positive gamma voltages;
an input selector configured to
output a plurality of distributed voltages based on the two output gamma voltages, second pixel data and the polarity signal; and
an interpolation amplifier including a plurality of input circuits, the interpolation amplifier configured to output an output voltage based on the plurality of distributed voltages.

17. The source driver of claim 16 wherein the polarity signal may change per line or per frame of a display panel.

18. The source driver of claim 16 wherein the digital to analog converter is configured to receive $2^{(N-K)}$ positive gamma voltages and $2^{(N-K)}$ negative gamma voltages, N being the number of bits in the first pixel data, and K being the number of bits in the second pixel data.

19. The source driver of claim 16, wherein a number of the plurality of distributed voltages is between 3 and $2^K$, K being the number of bits in the second pixel data.

20. The source driver of claim 19 wherein each of the input circuits includes two differential input pairs, and at least one of the input circuits receive two distributed voltages among the plurality of distributed voltages.

* * * * *